United States Patent [19]

Walczak

[11] Patent Number: 5,412,341
[45] Date of Patent: May 2, 1995

[54] POWER CONTROL APPARATUS AND METHOD FOR A RADIO FREQUENCY AMPLIFIER

[75] Inventor: Thomas J. Walczak, Woodstock, Ill.

[73] Assignee: Motorola, Schaumburg, Ill.

[21] Appl. No.: 143,688

[22] Filed: Oct. 28, 1993

[51] Int. Cl.⁶ .............................................. H03G 3/30
[52] U.S. Cl. ..................................... 330/138; 330/279; 330/280; 455/116; 455/126
[58] Field of Search ............... 330/129, 138, 141, 279, 330/280, 281; 455/116, 126, 127

[56] References Cited

U.S. PATENT DOCUMENTS 5,087,893  2/1992  Peterson et al. ..................... 330/296
5,150,075  9/1992  Hietala et al. ....................... 330/275

FOREIGN PATENT DOCUMENTS 69914  4/1982  Japan .................................. 330/138

Primary Examiner—James B. Mullins
Attorney, Agent, or Firm—Charles W. Bethards

[57] ABSTRACT

A power controller for a class C radio frequency power amplifier that exhibits an output power threshold, including a detector circuit (299) that detects a output power level to provide a level signal when the radio frequency power amplifier has achieved the output power threshold, and a comparator apparatus (245) that combines a reference signal and the level signal to provide a control signal that is arranged to establish the output power level, and a generator function (247) that provides the comparator apparatus a substitute level signal until the amplifier has achieved the output power threshold.

30 Claims, 2 Drawing Sheets

POWER CONTROL APPARATUS AND METHOD FOR A RADIO FREQUENCY AMPLIFIER

FIELD OF THE INVENTION

This disclosure deals generally with power control arrangements and more particularly but not limited to power control arrangements and methods for radio frequency amlifiers.

BACKGROUND OF THE INVENTION

Radio frequency (RF) power amplifiers are utilized to increase or amplify the radio frequency energy applied to a radio antenna for subsequent radiation. Because such amplifiers are relatively high power circuits, issues such as thermal efficiency and related matters must be carefully considered by practitioners. Some radio systems, such as those employing frequency or phase modulation wherein information is carried by modulating the frequency of a radio carrier rather than the amplitude, can advantageously use a radio frequency power amplifier operating in a class C (switched) mode.

Such a radio frequency power amplifier is typically more efficient than an amplifier operating in a class A mode (the amplifier is conducting a non zero bias current, or is direct current (DC) biased) and hence will consume less energy from, for example, a battery source. Theoretically a class C mode amplifier can be modeled as a switch that is toggled between an "on" and an "off" state at the radio signal's frequency. By selectively filtering the input and output wave forms to and from this switch the desired frequency signal may be obtained and the harmonics of the toggling frequency may be rejected. The duration of the "on" state will determine the output power from such an amplifier when other parameters are fixed. The advantage of the class C amplifier lies in the theoretical efficiency that may be obtained. Essentially when the switch is "off" no current flows and when the switch is "on" the potential across the switch is zero. Since power dissipated is the product of current times potential, the switch will theoretically dissipate zero power and the class C amplifier will be very efficient.

In practice the switch in a class C amplifier is a semiconductor transistor that has been configured as a power amplifier device. This switch unlike the model is not ideal. For example, the potential across the device will be nonzero because the transistor will have some forward resistance. Additionally, the transistor will have a current transfer characteristic that is often modeled as an exponential or other power law relationship between drive (base) current and load (collector) current at least during a nonzero switching time period. Furthermore most semiconductor devices exhibit a turn-on threshold that necessitates a minimum amount of bias or alternatively signal drive level before the device will provide any useful switching or amplification action. These issues among others, contribute to some problems for class C radio frequency power amplifiers, particularly during the period of time when a transmitter is being turned on.

During this time period when the amplifier is ramping up from zero output power to something approaching a final output power level the amplifier may generate spurious signals, such as harmonics or various combinations of harmonics of the drive signal frequency. These spurious signals may have energy components in spectral locations where other transmitters and receivers are authorized to operate. This spurious energy can cause radio interference that degrades the overall effectiveness of radio communications in these spectral locations and this may result in a violation of the regulations of various radio regulatory agencies, such as the Federal Communications Commission, and hence possible sanctions for the operator of the offending radio. Historically this has not been a major problem because the period of time when interference might exist was comparatively short relative to the total time the transmitter was turned on particularly given the relative infrequency of turning the transmitter on.

However, given the increased demands being placed on available spectrum, practitioners are proposing systems such as packet data systems and Time Division Multiple Access (TDMA) systems where the transmitter is turned on for a short period of time relatively often. In addition the spectrum where the spurious energy may fall is more and more likely to be occupied and regulated. Practitioners have proposed various methods of providing some degree of control over the characteristics of the amplifier during its ramp up period.

One known approach includes a power output control loop that gradually increases the allowed power out during a short time period at initial turn on. This approach suffers from the threshold effect, noted above, of semiconductor devices operating in a switched mode. In essence the control loop can not serve its purpose until an output is available from the amplifier. Another approach attempts to bias the semiconductor device in a class A or quasi class A mode for a short period prior to and during a portion of the ramp up period thus avoiding the threshold effect and providing a degree of control over the ramp up process. This approach results in some unnecessary battery drain and further because of the architecture and thus characteristics of semiconductor devices optimized for a switching function may contribute to reliability problems with the device.

Clearly a need exists for a radio frequency power amplifier that minimizes the spurious energy emitted during the time period when the amplifier is ramping up.

BRIEF DESCRIPTION OF THE DRAWINGS

The features of the present invention which are believed to be novel are set forth with particularity in the appended claims. The invention, itself, however together with further advantages thereof, may best be understood by reference to the accompanying drawings in which:

DETAILED DESCRIPTION OF A PREFERRED EMBODIMENT

Generally this disclosure deals with a power control arrangement for radio frequency power amplifiers as well as a method employed thereby. Particularly contemplated is a power controller for a radio frequency power amplifier operating in a class C or switching mode and exhibiting an output power threshold. This output power threshold may be thought of as a set of input conditions, such as input power or drive level together with any bias or control signal conditions below which the radio frequency power amplifier will not have any appreciable output power.

As an overview, the preferred embodiment utilizes a feedback loop that compares a level signal, specifically the amplifier output power level as detected at an output, with a reference signal to provide a control signal. The control signal is then applied to a control input of the amplifier to establish or control the output power level if and whenever the amplifier has achieved or satisfied the output power threshold. Otherwise, that is until the amplifier has achieved the output power threshold and therefore any output power can be detected, a substitute level signal is provided and combined with the reference signal and used in a secondary feedback loop to minimize any vaguaries, thus spurious energies generated, that may occur as a result of the open loop nature of the power controller at and below the output power threshold.

Figure 1:
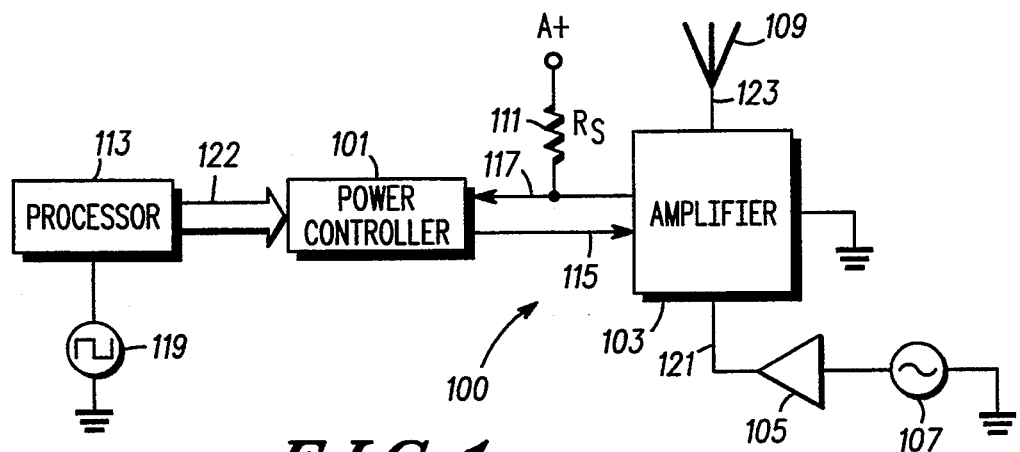
FIG. 1 is a block diagram of a radio transmitter having a power controller in accordance with a preferred embodiment of the instant invention.

The instant invention may be more fully described with reference to FIG. 1 which depicts a radio transmitter having a power control arrangement (100) including a power controller (101), an amplifier (103), an exciter (105), and a frequency reference (107) all intercoupled as shown to provide an output power signal at an output (123) to drive an antenna (109). The amplifier (103) is coupled to a power supply designated A+ through a resistor (111). Any voltage drop across the resistor (111), such as that produced by the current supplied to the amplifier (103), is coupled to the power controller (101) at an input (117). This voltage signal is used by power controller (101) to provide a control signal that is coupled to the amplifier (103) at a control input (115). A processor (113) is provided timing signals by a clock source (119) and the processor (113) then provides control signals, such as signals indicative of a reference level, a threshold level and various timing information to the power controller (101) at an input (122).

The processor (113) is based on a microprocessor (not specifically shown), such as a Motorola 68HC332 or other suitable processor, and includes all requsite interface circuitry and any memory that may be required. The power controller (101) may be a discrete circuit comprised of individual components but is preferably implemented in large part as an integrated circuit. In a preferred embodiment the amplifier (103) is a class C radio frequency power amplifier that due to the characterisitics of a class C amplifier exhibits an output power threshold, such as a Hitachi type PF1010 but may be any other suitable power amplifier. In any event the amplifier (103) is coupled to a combination of the exciter (105) and the reference element (107) at an input (121). The exciter (105) together with the reference element (107) provides an input RF signal for subsequent amplification by the amplifier (103).

Figure 2:
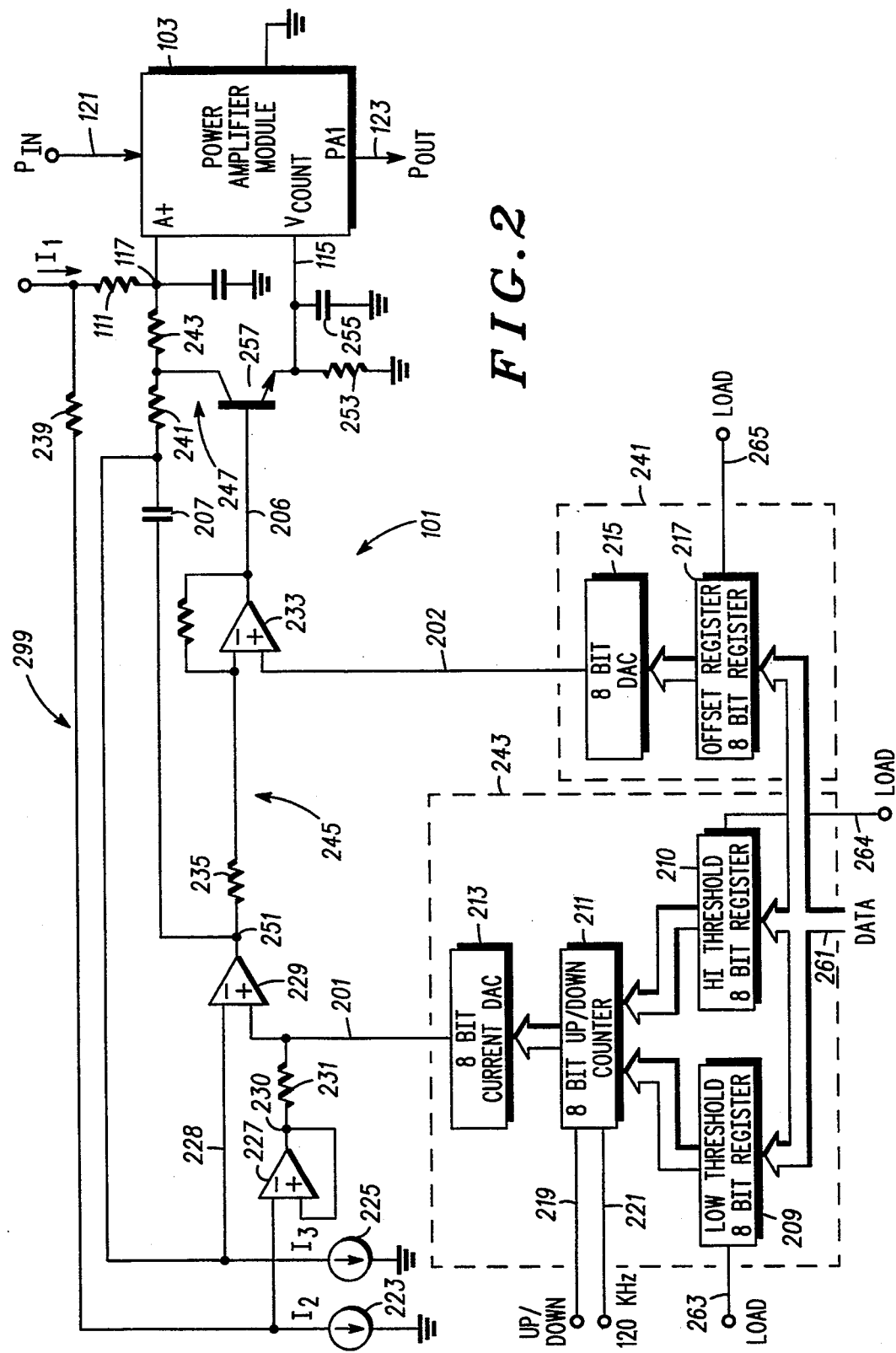
FIG. 2 is a more detailed block diagram of a power controller suitable for use in the FIG. 1 embodiment.

FIG. 2 depicts a more detailed embodiment of power controller (101). In the preferred embodiment, the power controller (101) is implemented substantially in an integrated circuit. Considering the power controller (101) in more detail, it is comprised of a detector circuit (299), a comparator apparatus (245), a generator function (247), a reference circuit (243), and a threshold circuit (241).

The detector circuit (299) is coupled to the amplifier (103) at input (117) and is arranged and constructed for detecting a output power level from the amplifier (103) to provide a level signal when the amplifier (103) has achieved the output power threshold. The detector circuit (299) includes a first level shifter that includes a series arrangement of resistors (243 & 241) connected from the input (117) to a current source (225). The junction between the series arrangement and the current source (225) is coupled to an input (228) of the comparator apparatus (245). Further included is a second level shifter comprised of a resistor (239) series coupled from A+ to a current source (223) for establishing a bias voltage at a junction of resistor (239) and the current source (223). The bias voltage is coupled to an input of and biases a unity gain amplifier (227). An output of the amplifier (227) is coupled to an input (230) of the comparator apparatus (245). The difference between the signals at the inputs (228 & 230) reflects the voltage drop across the resistor (111) and is the level signal indicative of the output power level of the amplifier (103).

The purpose of the level translators is to shift the voltages at the terminals of the resistor (111) to a voltage level that is compatible with the comparator apparatus (245). In the preferred embodiment, the voltage on the terminals of the resistor (111) is approximately six volts. The operating voltage of the comparator apparatus (245) is less than five volts, and it is preferable to have approximately two volts on the inputs (228) and (230) during normal operation. The level translator circuits reduce the six volt level to approximately two volts.

The comparator apparatus (245) is coupled to the detector circuit (299) at the inputs (228) & (230) and to the control input (115) of the amplifier (103) at output (206) via a transistor (257). The comparator apparatus (245) combines the level signal and a reference signal, provided by a reference circuit (243) at a reference input (201), to provide ultimately a control signal at the output (206) that is used to establish the output power level of the amplifier (103). The comparator apparatus (245) includes a comparator amplifier (229) coupled to the input (228) and the reference input (201), hence input (230) by a resistor (231). With this arrangement the output (251) of the comparator amplifier (229) will reflect an error signal proportional to the difference between the level signal and the reference signal. The error signal is coupled to a first input of an offset amplifier (233) by a resistor (235). A second input of the offset amplifier (233) is coupled to a threshold signal provided by the threshold circuit (241) at a threshold input (202). The threshold signal at the input (202) is substantially equal to a threshold level of the amplifier (103) as discussed below. An output of the offset amplifier (233) is coupled to the output (206) and will reflect the control signal and be proportional too a difference between the error signal and the threshold signal.

The output (206) is coupled to the transistor (257) which is included in a generator function (247). The generator function (247) is arranged and constructed to provide the comparator apparatus (245) a substitute level signal until the amplifier (103) has achieved the output power threshold. Specifically the output power threshold has been achieved when the input RF signal at input (121) together with the control signal at the control input (115) are such that the amplifier (103) has begun to put out radio frequency power at the output (123). The generator function (247), is comprised of resistors (241), (243), and (253), capacitors (207) and (255), and transistor (257).

To appropriately explain the operation of the generator function (247), some discussion of the operating characteristics of the amplifier (103) are required. The amplifier (103) is an RF power amplifier. Input to the amplifier on input (121) is the RF input signal or RF carrier which is to be amplified. The amplified RF signal is provided at the output (123). The gain of the amplifier (103) in a preferred embodiment is approximately 30 dB. Supply current is provided from A+ to the amplifier (103) by the resistor (111) at the input (117). The magnitude of this current is substantially proportional to the RF output power level at the output (123). In the preferred embodiment, the supply current is approximately zero amperes when there is no output power level and 750 milliamperes at full or rated output power level. The control signal or voltage is provided at the control input (115). This control voltage will not cause a power output from the amplifier until a threshold or turn on voltage is reached at the control input (117). Above the turn on or threshold voltage an increase in control voltage increases the output power level from the amplifier (103). In the preferred embodiment, the control voltage is zero to four volts and the turn on or threshold voltage is approximately 1.2 volts.

Referring back to the generator function (247), the control signal at the output (206) is amplified by a transistor (257) and coupled to the control input (115) of the amplifier (103). As will be discussed in detail below, the beginning or initial and ending or final values for the control signal, specifically voltages at the output (206) can be adjusted in the threshold circuit (241) and the reference circuit (243). In the preferred embodiment, the threshold circuit (241) is set to produce approximately one volt at the control input (115) and the reference circuit produces a voltage ramp that varies with time which starts at approximately 0.8 v and ends at approximately three volts. The end point is determined by the maximum or desired radio frequency output power level. Due to various component tolerances and environmental variations, such as temperature and so forth, the threshold voltage at the control input (115) should be set lower than the turn on or threshold voltage of the amplifier (103). This setting prevents a level signal at input (117) to the power controller (101) that is a false indication of the RF output power level.

When the control voltage on the control input (115) is below the turn on or threshold voltage of the amplifier (103), there is no current drawn by the amplifier (103) through the resistor (111) and consequently no level signal available to the power controller (101). From the descriptions herein the power controller (101) may be viewed as a high gain element that is employed in a feedback power control loop configuration. Without the generator function (247), the power controller (101) is operating in a very high gain, likely unstable, open loop mode during the time period when the control signal or voltage at the input (115) is below the threshold voltage of the amplifier (103). To remedy this potential situation the generator function (247) provides the substitute level signal by operating or closing a second feedback loop at least during this time period.

This second feedback loop produces a substitute level signal, specifically a change in signal level at the input (228) in response to a change at the output (206). The second feedback loop is substantially closing the feedback power control loop until the voltage on the control input (115) reaches the turn on or threshold voltage of the amplifier (103). This second feedback loop thereby minimizes any turn on transients that may result as a result of the power controller (101) operating in the open loop mode during the time period required for the amplifier (103) to achieve the output power threshold.

Considering in more detail, the reference circuit (243), depicted in FIG. 2, that is comprised of a low threshold register (209), a high threshold register (210), an up/down counter (211) and a current digital to analog (DAC) (213) all under the control of the processor (113) via the input (122), which input is a combination of a data buss (261) and various control inputs, such as (219, 221, 263, 264, & 265). The value in the low threshold register (209) is programmed by the processor (113). This value sets the starting count for the up/down counter (211). Likewise the value in the high threshold register (210) is set by the processor (113). This value sets the ending count for the up/down counter (211). The starting count corresponds to the minimum RF output power level from the amplifier (103) and the ending count corresponds to the maximum desired RF output power level from the amplifier (103). The up/down counter (211) is controlled by signals from the processor (113) at inputs (219) and (221). The signal at input (219) has one of two binary states. One state corresponds to an up count, beginning at the value in the low threshold register (209) and ending at the value in the high threshold register (210). The second state corresponds to a down count, beginning at the value in the high threshold register (210) and ending at the value in the low threshold register (209). The signal at the input (221) is the clock signal which causes the up/down counter (211) to change states or count. The frequency of the clock signal controls the time it takes the up/down counter (211) to count between the high and low thresholds. By changing the frequency of this clock signal, the required time to count from the high to low or low to high thresholds may be changed. This corresponds to changing the slope of the RF output power ramp and therefore the time duration required for the amplifier (103) to reach the rated or maximum power output level. The output of the up/down counter (211) is coupled to the current DAC (213). The current DAC (213) produces the reference signal, specifically a current output that is coupled to the input (201), which is proportional to the value in the up/down counter (211). In this manner, a rising current ramp or falling current ramp is generated at input (201), causing a voltage drop across the resistor (231), and thereby the control signal at the control input (115) is caused to ramp up or alternatively ramp down under carefully controlled circumstances. Hence any spurious signals produced by the amplifier (103) are minimized.

The threshold circuit (241) includes an offset register (217) and a DAC (215). The offset register (217) is programmed by the processor (113). The offset register (217) is coupled to the DAC (215). The DAC (215) produces the threshold signal, specifically a threshold or offset voltage at the threshold input (202). This threshold signal is proportional to the value in the offset register (217). The offset voltage signal at threshold input (202) sets a quiescent voltage at the control input (115) of the amplifier (103). The quiescent voltage at the control input (115) is the control signal when the RF output power level from the amplifier (103) is zero.

Figure 3:
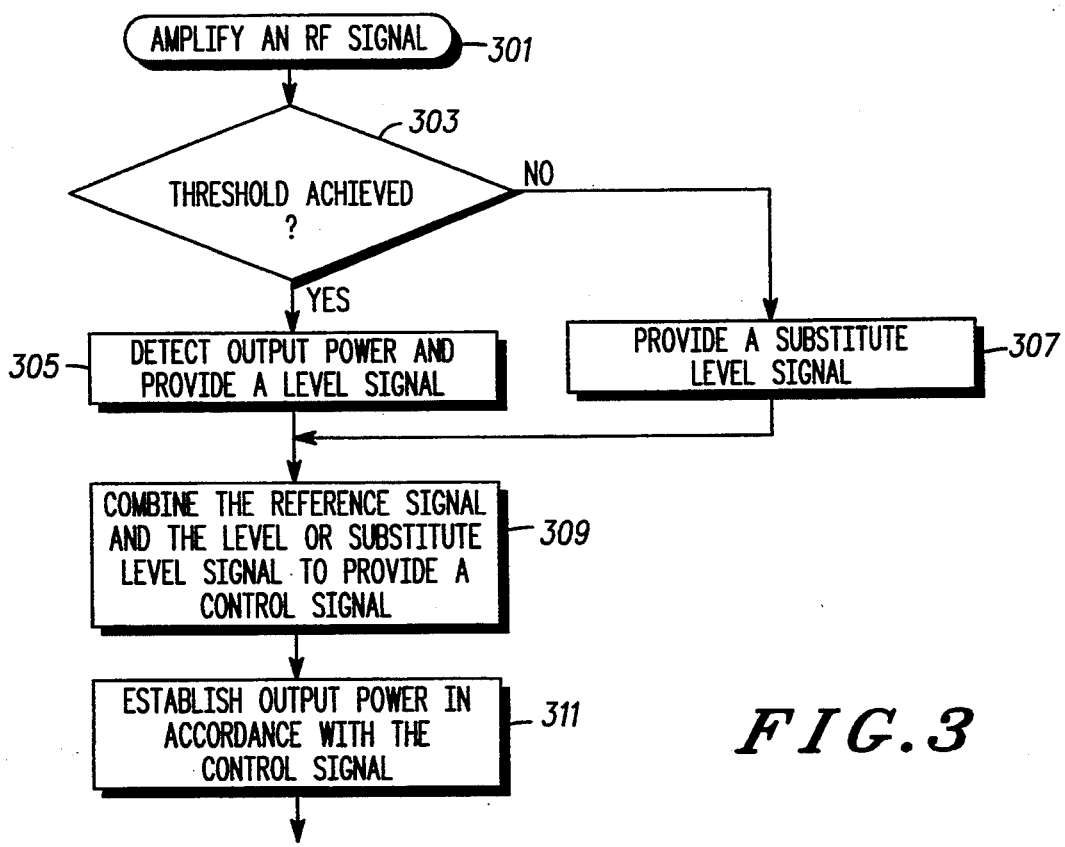
FIG. 3 is a process flow diagram illustrative of a method embodiment of the instant invention.

Referring to the FIG. 3 flow chart a method embodiment of the instant invention begins by amplifying an RF signal at step (301). At step (302) whether the output power threshold has been achieved is tested and if so the output power is detected and a level signal is provided at step (305). If not, a substitute level signal is provided at step (307). In either event, step (309) combines a reference signal and either the level signal or substitute level signal to provide a control signal. The control signal is then used to establish an output power level at step (311).

The instant invention has thus satisfied an urgent need in the field by providing an inventive apparatus and method for minimizing generation of any spurious energy during the period of time when the radio frequency power amplifier is ramping up to or ramping down from a rated power output level.

What is claimed is:

1. A power controller for a class C radio frequency power amplifier, the amplifier having an output and a control input and exhibiting an output power threshold, comprising in combination:
   detector means, coupled to the radio frequency power amplifier, for detecting an output power level to provide a level signal after the radio frequency power amplifier has achieved the output power threshold;
   comparator means, coupled to said detector means and the control input, for combining a reference signal and said level signal to provide a control signal, said control signal coupled to the control input and arranged to control said output power level; and
   generator means, coupled to said comparator means, for providing said comparator means a substitute level signal until the amplifier has achieved the output power threshold.

2. The power controller of claim 1 further including a threshold means, coupled to said control input, for setting an initial threshold level.

3. The power controller of claim 2 wherein the threshold means includes a digital to analog convertor.

4. The power controller of claim 2 further including a reference means for generating said reference signal.

5. The power controller of claim 4 wherein said reference means generates a time varying reference signal.

6. The power controller of claim 5 wherein said reference means includes a digital to analog convertor.

7. The power controller of claim 6 wherein said digital to analog convertor is driven by an up down counter.

8. The power controller of claim 7 wherein said up down counter is driven by a signal having a frequency, said frequency determining a characteristic of said time varying reference signal.

9. A radio transmitter having a power control arrangement, comprising in combination:
   amplifier means, operating in a class C mode, exhibiting an output power threshold, and having an output and a control input, for amplifying a radio frequency signal to provide an output power signal;
   detector means, coupled to said amplifier means, for detecting said output power signal to provide a level signal after said amplifier means has achieved said output power threshold;
   comparator means, coupled to said detector means and said control input, for combining a reference signal and said level signal to provide a control signal, said control signal coupled to said control input and arranged to control said output power level; and
   generator means, coupled to said comparator means, for providing said comparator means a substitute level signal until said amplifier means has achieved said output power threshold.

10. The radio transmitter of claim 9 further including a threshold means, coupled to said control input, for setting an initial threshold level.

11. The radio transmitter of claim 10 wherein the threshold means includes a digital to analog convertor.

12. The radio transmitter of claim 10 further including a reference means for generating said reference signal.

13. The radio transmitter of claim 12 wherein said reference means generates a time varying reference signal.

14. The radio transmitter of claim 13 wherein said reference means includes a digital to analog convertor.

15. The radio transmitter of claim 14 wherein said digital to analog convertor is driven by an up down counter.

16. The radio transmitter of claim 15 wherein said up down counter is driven by a signal having a frequency, said frequency determining a characteristic of said time varying reference signal.

17. In a power controller for a class C radio frequency power amplifier having an output and a control input, the amplifier exhibiting an output power threshold, a method including the steps of:
   detecting a output power level from the amplifier to provide a level signal after the amplifier has achieved the output power threshold;
   combining a reference signal and said level signal to provide a control signal, said control signal coupled to the control input and arranged to control said output power level; and
   providing a substitute level signal for said combining step, until the amplifier has achieved the output power threshold.

18. The method of claim 17 further including a step of setting an initial threshold level at the control input.

19. The method of claim 18 wherein the step of setting an initial threshold utilizes a digital to analog convertor.

20. The method of claim 18 further including a step of generating said reference signal.

21. The method of claim 20 wherein said step of generating said reference signal includes generating a time varying reference signal.

22. The method of claim 21 wherein said step of generating said reference signal utilizes a digital to analog convertor.

23. The method of claim 22 further including a step of driving said digital to analog convertor with an up down counter.

24. The method of claim 23 further including a step of driving said up down counter with a signal having a frequency, said frequency determining a characteristic of said time varying reference signal.

25. In a radio transmitter having a power control arrangement, a method including the steps of:
   amplifying a radio frequency signal to provide an output power signal, said amplifying step using an amplifier, operating in a class C mode, exhibiting an output power threshold, and having an output and a control input;

detecting said output power signal to provide a level signal after said amplifier has achieved said output power threshold;

combining a reference signal and said level signal to provide a control signal controlling, responsive to said control signal, said output power level; and providing a substitute level signal to said combining step until said amplifier means has achieved said output power threshold.

26. The method of claim 25 further including a step of setting an initial threshold level at said control input.

27. The method of claim 26 further including a step of generating said reference signal.

28. The method of claim 27 wherein said step of generating said reference signal provides a time varying reference signal.

29. The method of claim 28 wherein said step of generating said reference signal utilizes a digital to analog convertor.

30. The method of claim 29 further including a step of driving said digital to analog convertor with an up down counter.

* * * * *